(12) United States Patent
Oka et al.

(10) Patent No.: US 8,427,173 B2
(45) Date of Patent: Apr. 23, 2013

(54) OPEN FUSE DETECTION BY NEUTRAL POINT SHIFT

(75) Inventors: Toshiaki Oka, Houston, TX (US); Mike C Daskalos, Magnolia, TX (US)

(73) Assignee: Toshiba International Corporation, Houston, TX (US)

( * ) Notice: Subject to any disclaimer, the term of this patent is extended or adjusted under 35 U.S.C. 154(b) by 678 days.

(21) Appl. No.: 12/428,876

(22) Filed: Apr. 23, 2009

(65) Prior Publication Data

US 2010/0271045 A1 Oct. 28, 2010

(51) Int. Cl.
*G01R 31/02* (2006.01)
(52) U.S. Cl.
USPC ............. 324/550; 324/510; 324/520; 324/66; 324/67
(58) Field of Classification Search .................. 324/510, 324/520, 66, 67, 550
See application file for complete search history.

(56) References Cited

U.S. PATENT DOCUMENTS

| | | | | |
|---|---|---|---|---|
| 2,810,865 A * | 10/1957 | Minder | ........................ | 361/17 |
| 4,156,185 A * | 5/1979 | Kelley et al. | .................. | 324/107 |
| 4,565,998 A * | 1/1986 | Tsuji et al. | ..................... | 340/645 |
| 4,713,716 A * | 12/1987 | Takemura et al. | ................. | 361/2 |
| 5,182,547 A * | 1/1993 | Griffith | ......................... | 340/664 |
| 5,534,768 A * | 7/1996 | Chavannes et al. | ............ | 323/267 |
| 7,764,473 B2 * | 7/2010 | Shaak et al. | .................... | 361/42 |
| 2007/0064363 A1 * | 3/2007 | Nielsen et al. | .................. | 361/90 |

* cited by examiner

*Primary Examiner* — Huy Q Phan
*Assistant Examiner* — Temilade S Rhodes-Vivour
(74) *Attorney, Agent, or Firm* — Banner & Witcoff, Ltd.

(57) ABSTRACT

Systems and methods are shown for detecting a blown fuse in a three-phase line by comparing neutral points in the line before and after the fuses. Diode rectifier circuits may be used to compare the neutral points and generate a DC output voltage when neutral points are off from one another, and photocoupler circuits may provide electrical isolation when signaling a neutral point shift. The neutral points compared need not be on immediate sides of the fuses, so intermediate components may exist, and in some embodiments one of the compared points may be within a load connected to the three-phase line.

16 Claims, 5 Drawing Sheets

OPEN FUSE DETECTION BY NEUTRAL POINT SHIFT

FIELD OF THE SPECIFICATION

The present application relates generally to three-phase power systems, and more particularly to detecting open fuses in a three-phase power system.

BACKGROUND

Fuses are presently used to protect electrical circuitry from excessive current flow, and a current-carrying portion of the fuse will literally melt, or "blow," when the current passing through the fuse rises too high. When a fuse blows, it opens the electrical circuit path it was in, and components relying on the current flowing through that path no longer receive the current. In some situations, the opening of that electrical circuit path might not be immediately apparent to an operator of the system, and damage can occur to components in the system. For example, a three-phase power supply system may supply power to a load, and if a fuse blows in one of the phases, some types of loads will, by the nature of their operation (e.g., and not necessarily by design), draw increased current from the other two phases. This increased current draw risks damaging components in the system.

Accordingly, it is desirable to be able to detect a blown fuse quickly, so that those components may be shut down to avoid damage. However, the traditional method of detecting a blown fuse—a visual inspection of the fuse itself—may not be quick enough to avoid that damage.

To help detect a blown fuse, some fuses include switches that are thrown when the fuse blows. That thrown switch may be coupled to a monitoring circuit, which may detect the thrown switch and alert an operator. Such switched fuses are helpful, but they are not always available. For example, in certain higher voltage applications, a three-phase line may operate at potentials that are thousands of volts above the ground of an external monitoring circuit. It may be difficult, if not impossible, to find a switched fuse with enough voltage isolation to allow it to be used for such higher voltage applications. There are also systems that detect blown fuses by monitoring the voltage across each fuse individually. However these systems may require the use of a large number of isolation devices (one per fuse) for three phase systems. When there are multiple three phase circuits involved, it can become expensive to monitor each fuse individually.

Accordingly, there remains a need to promptly detect a blown fuse.

SUMMARY

Various features described herein may be used to detect a blown fuse. In some embodiments, the system may include a comparator rectifier having input terminals connected to receive three-phase neutral points on opposite sides of fuses in a three-phase line, and a comparator light-emitting diode, coupled to output terminals of the comparator rectifier.

Some embodiments may further include a light detector, positioned to detect light emitted by the light-emitting diode; and a monitoring circuit, configured to determine when one or more of the fuses has blown based on whether the light detector detects light from the light-emitting diode. The monitoring circuit may be configured to take suitable action in response to detecting a blown fuse, such as issuing an audible or visible alert, and/or shutting down certain pieces of equipment before they are damaged.

The system may include an optical transmission circuit, coupled to the three-phase line on a load side of the fuses, wherein the optical transmission circuit includes an optical transmission circuit rectifier having input terminals coupled to at least two lines of the three-phase line, and output terminals coupled to an optical transmission circuit light-emitting diode. The system may include a comparator circuit phototransistor, positioned to detect light emitted by the comparator circuit light-emitting diode, and having output terminals connected across terminals of the optical transmission circuit light-emitting diode.

Multiple comparator circuits may be monitored using the same monitoring circuit, by simply replicating the comparator circuit and tying their outputs to the monitoring circuit.

In some embodiments, the comparator circuit may use a DC bus neutral point as one of the compared neutral points.

Using the above, the system may monitor for blown fuses by detecting three-phase neutral point shift between the two positions, and infer a blown fuse from such a shift. Photocouplers may be used to provide electrical isolation between the comparator circuit and the monitoring circuit, and when a blown fuse is detected, the system may act to sound an alarm, display an alert, and/or shut down system components to reduce risk of damage.

BRIEF DESCRIPTION OF THE FIGURES

A more complete understanding of the features described herein and the advantages thereof may be acquired by referring to the following description in consideration of the accompanying drawings, in which like reference numbers indicate like features, and wherein.

DETAILED DESCRIPTION

In the following description, reference is made to the accompanying drawings, which form a part hereof, and in which is shown by way of illustration various features that may be used. It is to be understood that other embodiments may be utilized and structural and functional modifications may be made without departing from the scope and spirit of the present application.

Figure 1A:
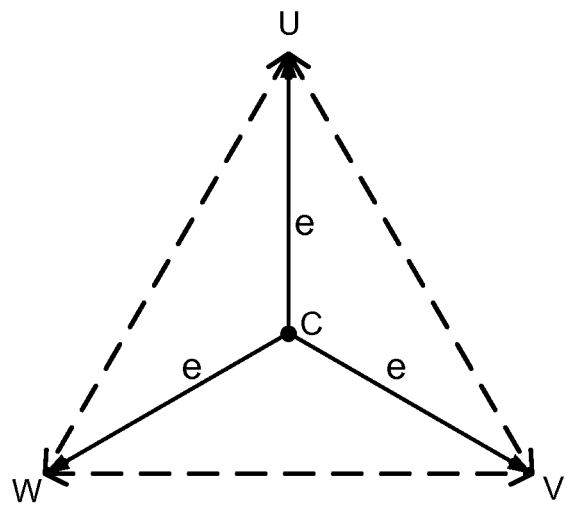
FIG. 1A illustrates a phase diagram for a three-phase system.
Figure 1B:
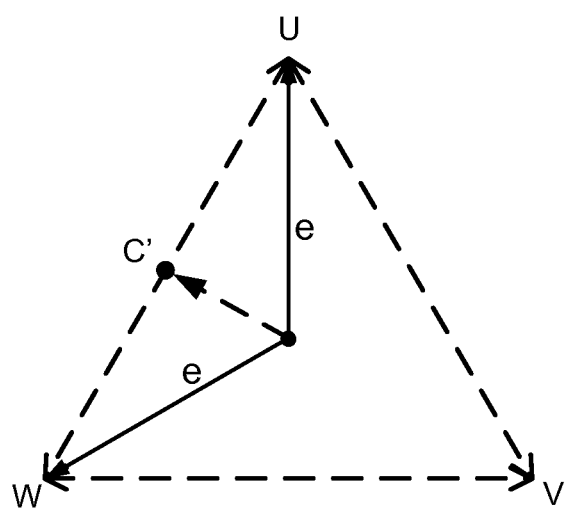
FIG. 1B illustrates a phase diagram for a three-phase system in which one of the phase lines has suffered a break, such as a blown fuse.

As will be described further below, features herein may detect a blown fuse in a three-phase system by monitoring the neutral point of the three phases before and after the fuses. FIG. 1A illustrates a phase diagram showing the angular relationship and magnitude (e) of the three phases (U, V, W), and how the central neutral point (C) is positioned during normal operation. In FIG. 1B, the V-phase line has suffered a break (e.g., blown fuse), and the resulting two-phase system no longer has the same central neutral point (C). Instead, the neutral point has shifted to a different phase/magnitude position. Circuits described herein may detect this shift in the three-phase neutral point, and determine that one of the phases has suffered a break or blown fuse.

Figure 2A:
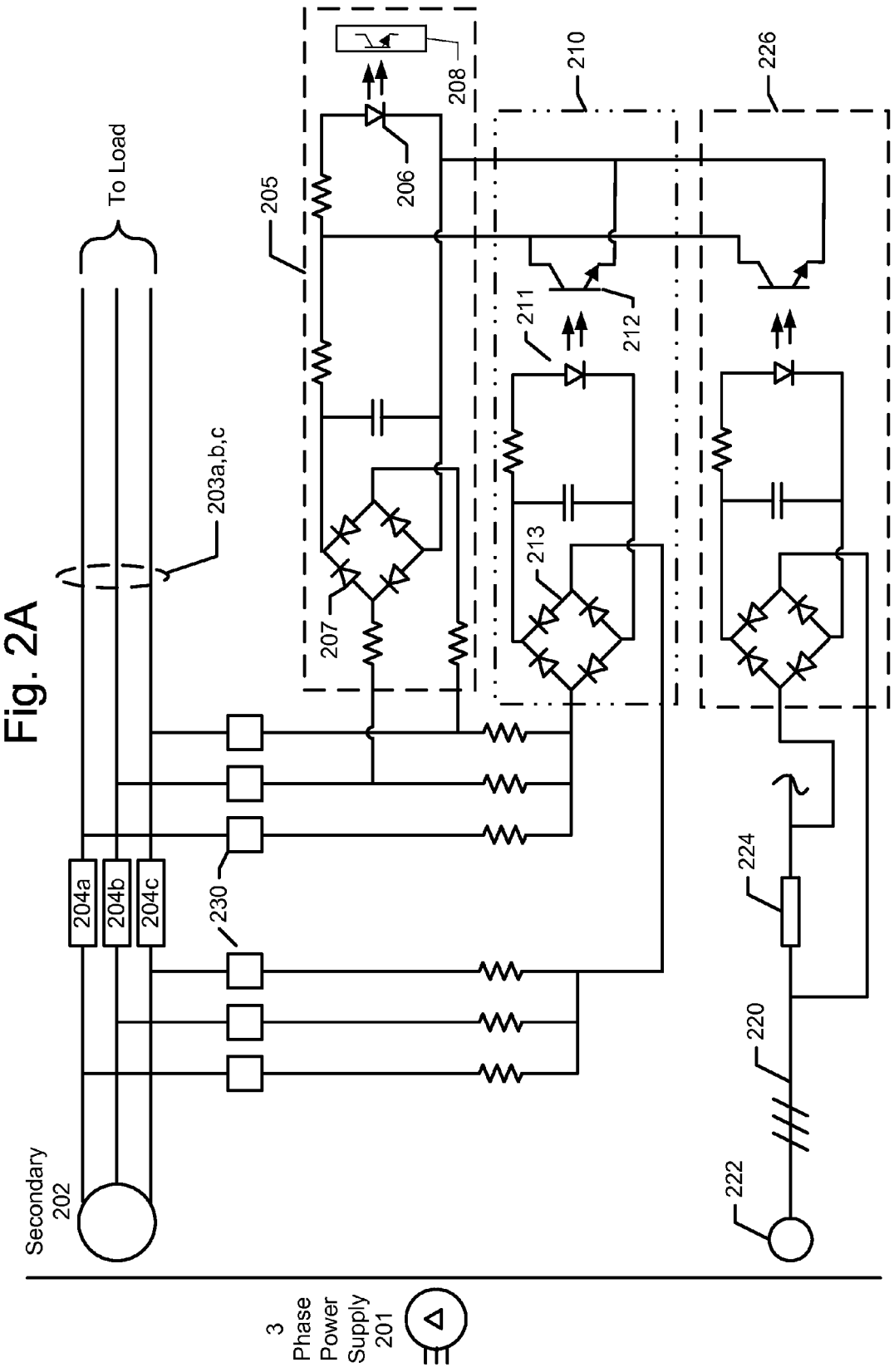
FIGS. 2A & 2B illustrate example configurations of a fuse detection system.

FIG. 2A illustrates an example configuration that may be used to detect blown fuses by detecting a resulting neutral point shift. In FIG. 2A, a three-phase power supply primary winding 201 may induce voltage in three-phase secondary windings 202, which may then be connected to three supply lines 203a,b,c to a load. Those lines may each include a fuse 204a,b,c.

The system may include an optical transmitter circuit 205. The optical transmitter circuit 205 may include a light-emitting diode 206 that may be coupled to a bridge rectifier 207 which, in turn, may receive power from any two of the phase lines, such as lines 203b and 203c shown in FIG. 2A. Additional circuit elements may be present as well, such as various line resistances and capacitances, and are illustrated in FIG. 2A.

During normal operation, the bridge 207 may generate a DC voltage across the terminals of the diode 206, causing it to illuminate. That light may be detected by an optical receiver 208, which may be coupled to a monitoring circuit (see FIG. 5 below). The monitoring circuit may be configured to detect that light as an indication that the fuses are operating normally.

The system may also include a comparator circuit 210, which may be connected to the three-phase supply lines 203a, b,c on opposite sides of the fuses 204a,b,c, as illustrated in FIG. 2A. The comparator circuit 210 may be coupled to compare the neutral point voltage levels on those opposite sides, and may be configured to deactivate the light-emitting diode 206 if the neutral points on opposite sides are sufficiently different.

In the illustrated example, the comparator circuit 210 may include a photocoupler circuit having a light-emitting diode 211 and phototransistor receiver 212, which may be connected across the leads of the diode 206. The photocoupler circuit may be a single integrated chip having the diode 211 and phototransistor 212. The ends of the diode 211 may be coupled to a rectifier bridge 213. The bridge 213 may have one input connected to the three phases of the supply line on one side of the fuses 204a,b,c, and another input connected to the three phases of the supply line on the other side of the fuses 204a,b,c, as illustrated in FIG. 2A.

In operation, the bridge 213 becomes supplied with the two neutral points that exist before and after the fuses 204a,b,c in the three-phase supply lines 203a,b,c. If the two neutral points are close together in voltage and phase (as would be expected during normal operation when the fuses 204a,b,c are intact), then the bridge 213 will supply no (or minimal) output DC voltage, and diode 211 will not be energized. The absence of light from diode 211 allows the phototransistor 212 to remain off.

In operation, if one or more of the fuses 204a,b,c has blown, then the neutral point after the fuses (to the right in FIG. 2A) will be shifted with respect to the neutral point before the fuses. This difference between the neutral points causes bridge 213 to supply a DC voltage across its outputs, and that voltage energizes diode 211, causing it to illuminate. The illumination of diode 211 turns on phototransistor 212, which in turn shorts out the diode 206. Shorting out diode 206 causes it to cease emitting light.

The phototransistor 208 detects this loss of light, and the monitoring circuit (discussed below) may then determine that a fuse has blown.

Thus far, the FIG. 2A example embodiment includes a single comparator circuit 210, comparing the neutral points on opposite sides of fuses in a single three-phase line 203a, b,c, and providing an indication to a monitoring circuit in the event of a fuse break. Additional lines may be monitored using the same monitoring circuit. For example, FIG. 2A illustrates a second three-phase line 220 coupled to a second set of secondary windings 222, with a second set of fuses 224, and connected to a second load (not shown). The three phase lines/fuses have been consolidated in the figure for simplicity.

A second comparator circuit 226 may be connected across the opposite ends of the fuses 224, in the same manner as the comparator 210, but receiving inputs from the neutral points of the second line 220. The output of the second comparator circuit's phototransistor, however, may be connected across the light-emitting diode 206 as well, in parallel with the output of the first comparator 210. Accordingly, in operation, if the second comparator detects a shift in its own neutral point, it can similarly short out/shut off diode 206, triggering the monitoring circuit to take action for a blown fuse.

The FIG. 2A example shows one possible embodiment, but variations may be made. For example, the various resistances and capacitances in the lines are illustrated, but they may be rearranged/moved as desired. Terminal blocks 230 are also illustrated, and may be used to electrically couple a circuit board containing the illustrated components to the three-phase lines 203a,b,c. Also, components need not be grouped as illustrated. For example, comparator 210 is described as having the bridge 213, diode 211 and phototransistor 212, but the comparator 210 need not include all of those components as a single unit, and one or more of those components may be external to the comparator. Additionally, other components may be inserted between the various illustrated components, provided the inserted components do not otherwise disturb the operation described herein (e.g., the illustrated connections need not be "direct, immediate" connections, although they may be if desired).

As another example, although FIG. 2A illustrates two comparators 210/226, any number of additional comparator circuits may be added in parallel, allowing the monitoring circuit to monitor all of the different three-phase lines in a given system. In some embodiments, sixteen (16) different detection circuits can be used to monitor 48 700 v fuses in a 7200 v class system.

Figure 2B:
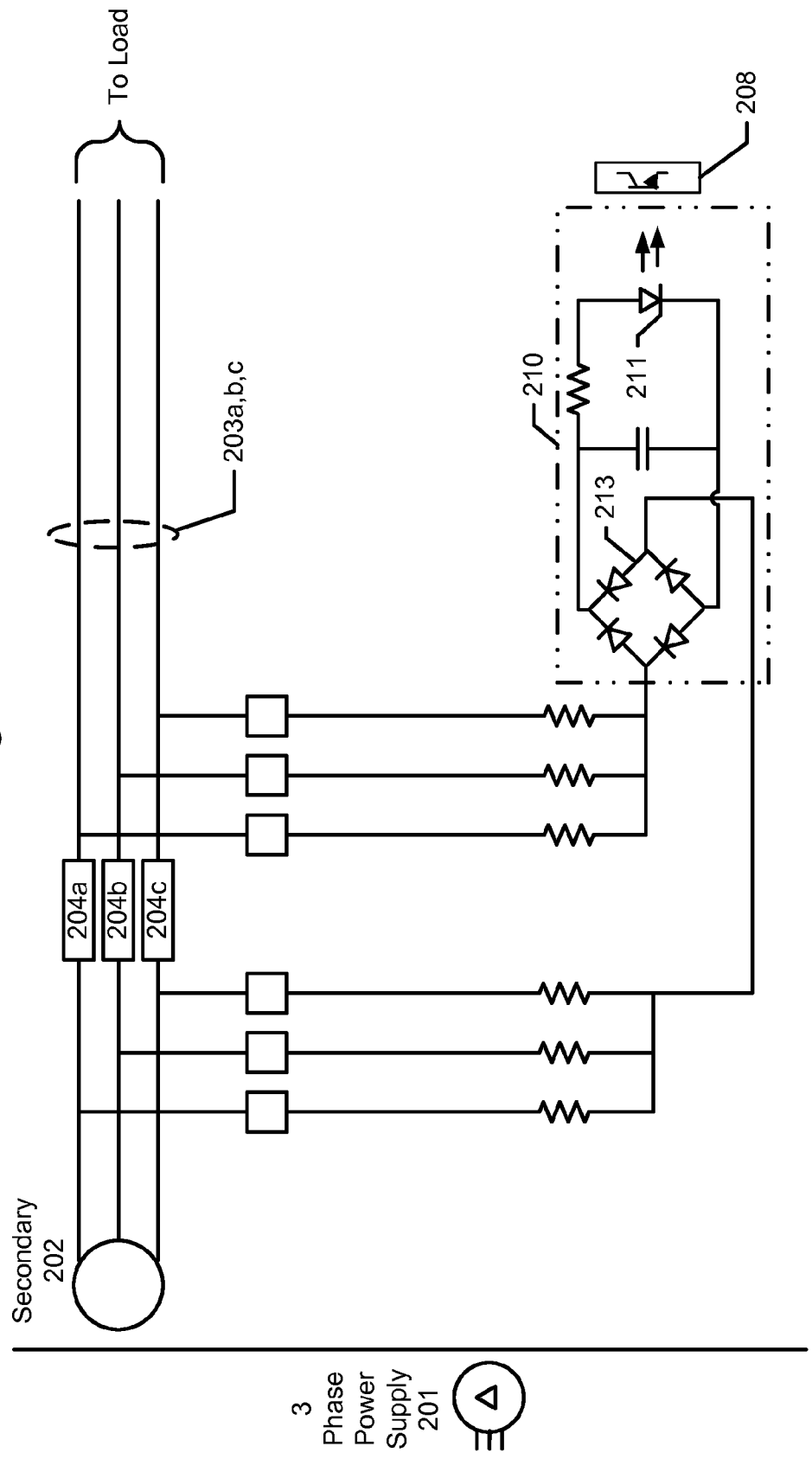

As another example, the optical transmitter circuit 205, as depicted, allows for a degree of redundancy, since if a fuse blows in one of the supply lines to that circuit (e.g., in FIG. 2A, fuses 204b or 204c), then the optical transmitter circuit 205 itself will shut down the diode 206, without requiring the comparator circuits 210/226. However, the optical transmitter circuit 205 may simply be omitted if desired. For example, the light from the comparator diode 211 may be detected by the monitoring circuit photodetector. FIG. 2B illustrates such an alternative embodiment. Other alternative embodiments may rearrange elements, reverse the logic (e.g., perhaps having an illuminated diode indicate a line break), consolidate and/or divide circuit elements, etc., and achieve the same end result—detection of blown fuses.

Figure 3:
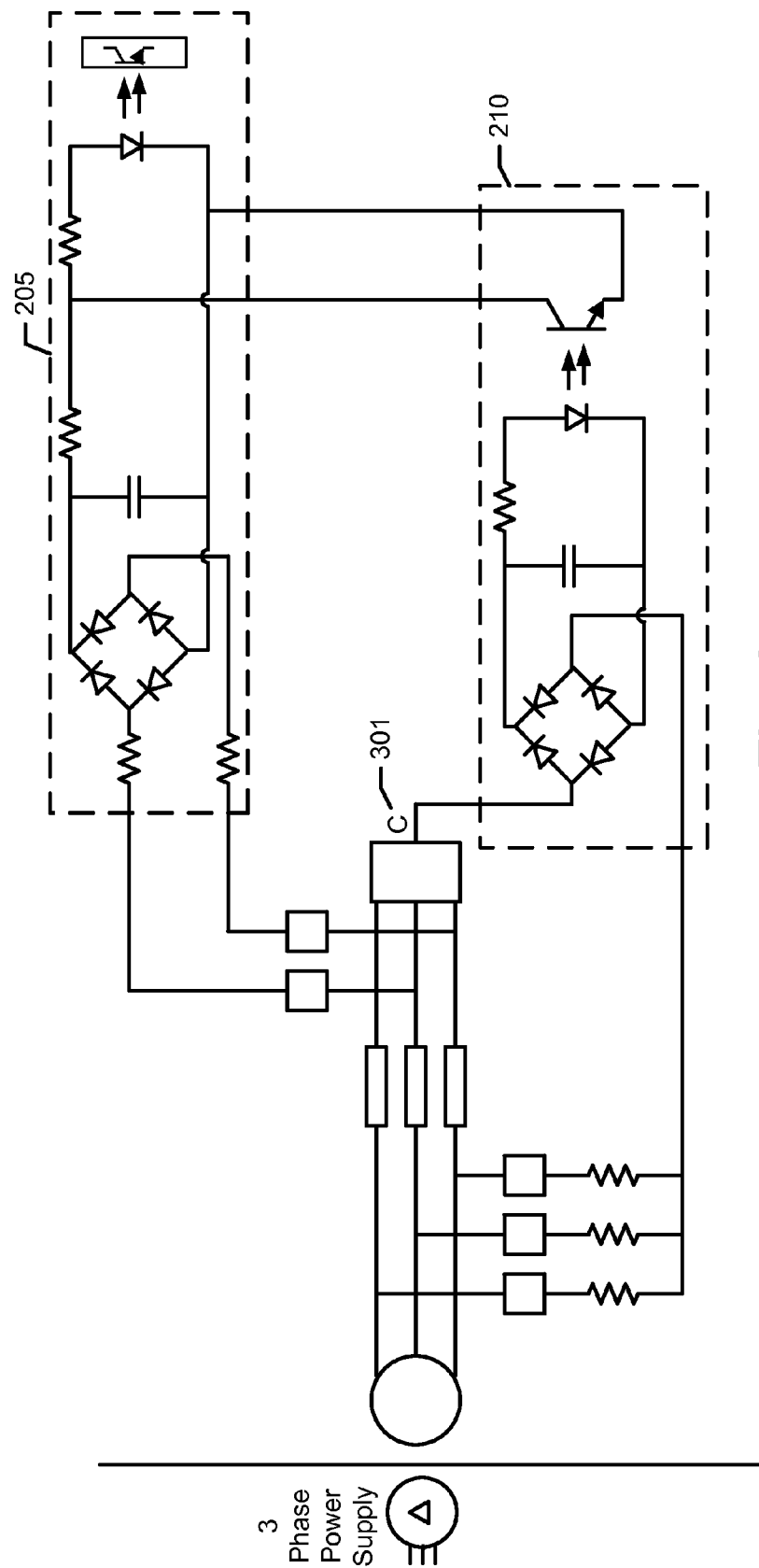
FIG. 3 illustrates an alternative embodiment of a fuse detection system.

As another alternative embodiment, the comparator 210 need not be coupled to immediately opposite sides of the fuses. Instead, the inputs to the comparator may be at any two points that would suffer a neutral point shift in the event of a fuse break. For example, one end of the comparator may be coupled to a neutral point of the load, if the load has a neutral point such as a DC bus of a rectifier. FIG. 3 illustrates this alternative embodiment, in which the optical transmitter 205 and comparator 210 are still present, but one input end of the comparator 210's bridge is coupled to a neutral point 301 (point "C") of a rectifier's DC bus.

Figure 4:
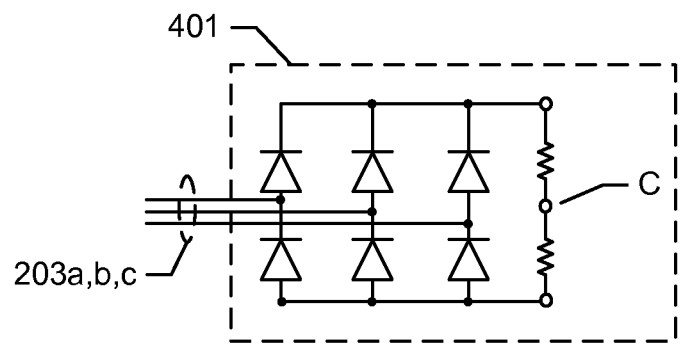
FIG. 4 illustrates a six-pulse rectifier that may be used as a load in the FIG. 3 example.

FIG. 4 illustrates an example of a six-pulse three-phase rectifier that can be the load in FIG. 3. The rectifier 401 may connect the three phase lines 402 to points between pairs of diodes, as shown, and the neutral point C of the DC bus may be used as the second input point for the FIG. 3 comparator.

Figure 5:
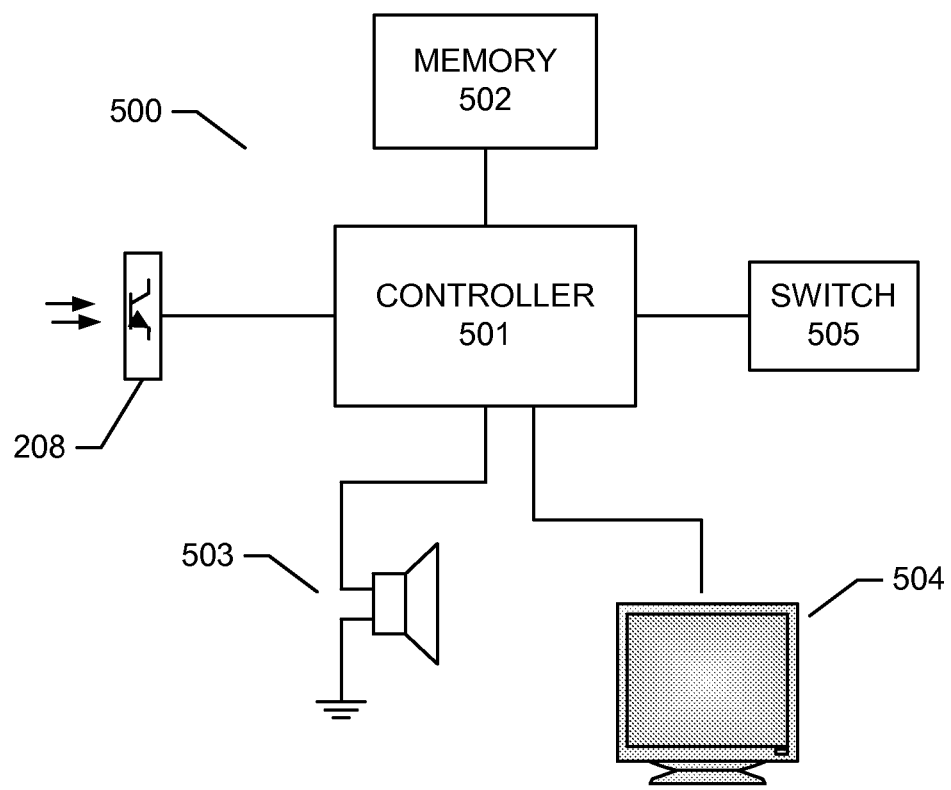
FIG. 5 illustrates an example controller circuit that may be used in conjunction with the embodiments shown in the figures.

FIG. 5 illustrates basic components of a monitoring circuit 500 that may be used in connection with the various embodiments described above. The monitoring circuit 500 may operate under the control of a controller 501, which may be a programmed microprocessor executing instructions stored in a memory 502. Memory 502 may be any type of computer-readable medium, such as a hard disk, floppy disk, compact disk (CD), read-only memory, random access memory, flash memory, etc.

The controller 501 may receive an input from the phototransistor receiver 208, and if the receiver 208 receives a light, its transistor is on, and the controller 501 knows that the fuses are intact. If the light is lost, however, then the controller 501 may be configured/programmed to take responsive action, such as sounding an alarm on a speaker 503, displaying an error message on a display 504, and/or controlling switching 505 to shut down portions of the system that may be damaged if operation is permitted with a blown fuse. For example, some loads may continue to draw current from the other two phase lines, should the third phase line break due to a blown fuse, and may actually draw excessive levels of current to compensate for the downed phase line. That excess current may further damage components in the system, so monitoring circuit 500 may be configured to shut the load down when a fuse break is detected.

The examples above generally include a circuit that is configured to compare three-phase neutral points from opposite sides of fuses in the three-phase line, and an isolation circuit (e.g., the various optical transmitters) that allows this high-voltage neutral point comparison circuit to provide a signal to a lower voltage (e.g., control board voltage) control/monitoring circuit. This comparison and isolation may be accomplished using other techniques as well. For example, two three-phase transformers (e.g., one on each side of the fuses) may be used to create/receive the neutral points on the three-phase line, and those transformers may be used to induce lower-level voltages on a control/monitoring circuit (e.g., stepping down the voltages at transformer primary windings to a lower level at transformer secondary windings), which may then use any desired voltage comparison circuit to compare the two induced voltages and determine when the neutral point has shifted.

As another example, the optical isolation described above may be achieved using relays instead of the optical transmission/reception. For example, the diode 211 and phototransistor 212 (e.g., a photocoupler) may be replaced by a relay circuit. Instead of having the bridge voltage illuminate the diode 211, the voltage from the bridge may be used to throw a relay switch, closing a circuit line in the control/monitoring circuit and triggering a blown fuse response.

The illustrative features described above are examples. The scope of the present patent should not be limited to require all described features, but should rather only be limited by the claims that follow.

We claim:

1. A detection system, comprising:
a comparator rectifier having input terminals connected to receive three-phase neutral points on opposite sides of fuses in a three-phase line;
a comparator light-emitting diode, coupled to output terminals of the comparator rectifier; and
an optical transmission circuit, coupled to the three-phase line on a load side of the fuses, wherein the optical transmission circuit includes an optical transmission circuit rectifier having input terminals coupled to at least two lines of the three-phase line, and output terminals coupled to an optical transmission circuit light-emitting diode.

2. The detection system of claim 1, further comprising:
a light detector, positioned to detect light emitted by the optical transmission circuit light-emitting diode; and
a monitoring circuit, configured to determine when one or more of the fuses has blown based on whether the light detector detects light from the optical transmission circuit light-emitting diode.

3. The detection system of claim 2, wherein the monitoring circuit is further configured to shut down a load in response to determining that a fuse has blown.

4. The detection system of claim 2, wherein the monitoring circuit is further configured to generate an audible or visible alert in response to determining that a fuse has blown.

5. The detection system of claim 1, wherein one of the input terminals is coupled to all three lines of the three-phase line.

6. The system of claim 1, further comprising a rectifier load coupled to the three-phase line, wherein one of the comparator rectifier input terminals is coupled to a DC bus neutral point in the rectifier load connected to the three-phase line.

7. A detection system, comprising:
a comparator circuit rectifier having input terminals connected to receive three-phase neutral points on opposite sides of fuses in a three-phase line;
a comparator circuit light-emitting diode, coupled to output terminals of the comparator circuit rectifier;
an optical transmission circuit, coupled to the three-phase line on a load side of the fuses, wherein the optical transmission circuit includes an optical transmission circuit rectifier having input terminals coupled to at least two lines of the three-phase line, and output terminals coupled to an optical transmission circuit light-emitting diode; and
a comparator circuit phototransistor, positioned to detect light emitted by the comparator circuit light-emitting diode, and having output terminals connected across terminals of the optical transmission circuit light-emitting diode.

8. The detection system of claim 7, wherein the comparator circuit rectifier, light-emitting diode and phototransistor comprise a first comparator circuit, and the system further comprises a second comparator circuit coupled across opposite sides of fuses in a second three-phase line, wherein output terminals of a phototransistor of the second comparator circuit are connected in parallel with the output terminals of the phototransistor of the first comparator circuit.

9. The detection system of claim 7, further comprising a rectifier load coupled to the three-phase line, wherein one of the comparator circuit rectifier input terminals is coupled to a DC bus neutral point in a rectifier load connected to the three-phase line.

10. A fuse monitoring method, comprising:
detecting, by a comparison circuit, a three-phase neutral point shift between two positions on opposite sides of fuses in a three-phase line; wherein the comparison circuit includes an optical transmission circuit, coupled to the three-phase line on a load side of the fuses, wherein the optical transmission circuit includes an optical transmission circuit rectifier having input terminals coupled to at least two lines of the three-phase line, and output terminals coupled to an optical transmission circuit light-emitting diode; and determining, by a monitoring circuit, that one or more of the fuses has blown in response to detecting the neutral point shift, and signaling an alert of the blown fuse, wherein one of the positions is a neutral point on a DC bus of a rectifier load that is coupled to the three-phase line.

11. The method of claim 10, further comprising:
using a rectifier bridge to compare the three-phase neutral points at positions on opposite sides of the fuses in the three-phase line.

12. The method of claim 10, further comprising:
using a light emitting diode to signal a three-phase neutral point shift to the monitoring circuit.

13. The method of claim 12, further comprising using the monitoring circuit to monitor three-phase neutral point shifts across fuses in a plurality of separate three-phase lines.

14. The method of claim 10, further comprising automatically shutting down a component in response to determining that one of the fuses has blown.

15. The method of claim 10, further comprising signaling, by the comparison circuit, a detected neutral point shift by closing a relay of the monitoring circuit.

16. The method of claim 10, further comprising:
using transformers to receive three-phase neutral points on opposite sides of the fuses, wherein secondaries of the transformers are used to receive induced stepped-down voltages from primaries of the transformers; and using a voltage comparison circuit to compare the induced stepped-down voltages.

\* \* \* \* \*